US012343778B2

(12) United States Patent
Kumagai et al.

(10) Patent No.: US 12,343,778 B2
(45) Date of Patent: Jul. 1, 2025

(54) DIE FOR IRONING WORKING AND DIE MODULE

(71) Applicant: TOYO SEIKAN GROUP HOLDINGS, LTD., Tokyo (JP)

(72) Inventors: Takuho Kumagai, Yokohama (JP); Kenichi Takao, Yokohama (JP); Ryozo Shiroishi, Yokohama (JP); Masahiro Shimamura, Yokohama (JP); Naoya Matsumoto, Yokohama (JP)

(73) Assignee: TOYO SEIKAN GROUP HOLDINGS, LTD., Tokyo (JP)

( * ) Notice: Subject to any disclaimer, the term of this patent is extended or adjusted under 35 U.S.C. 154(b) by 826 days.

(21) Appl. No.: 17/099,487

(22) Filed: Nov. 16, 2020

(65) Prior Publication Data

US 2021/0069767 A1    Mar. 11, 2021

Related U.S. Application Data

(63) Continuation of application No. 15/750,224, filed as application No. PCT/JP2016/073841 on Aug. 15, 2016, now abandoned.

(30) Foreign Application Priority Data

Aug. 26, 2015 (JP) ................... 2015-166675

(51) Int. Cl.
*B21D 22/28* (2006.01)
*B21D 37/01* (2006.01)
(Continued)

(52) U.S. Cl.
CPC ............. *B21D 22/28* (2013.01); *B21D 37/01* (2013.01); *C23C 16/27* (2013.01); *B21D 37/16* (2013.01); *B21D 37/18* (2013.01)

(58) Field of Classification Search
CPC ........ B21D 22/28; B21D 37/01; B21D 37/16; B21D 37/18; C23C 16/27
(Continued)

(56) References Cited

U.S. PATENT DOCUMENTS 3,945,231 A * 3/1976 Imazu .................... B21D 22/28
413/1
5,020,350 A * 6/1991 Knepp .................... B21D 22/28
72/347

(Continued)

FOREIGN PATENT DOCUMENTS

CN    102257176 A    11/2011
CN    104364029 A    2/2015
(Continued)

OTHER PUBLICATIONS

Communication dated Dec. 13, 2019, from the Taiwanese Intellectual Property Office in application No. 105126676.
(Continued)

*Primary Examiner* — Adam J Eiseman
*Assistant Examiner* — Fred C Hammers
(74) *Attorney, Agent, or Firm* — Sughrue Mion, PLLC

(57) ABSTRACT

A method of producing aluminum cans, including an ironing step using an ironing die (30). The ironing die has a carbon film (50) formed as to cover a working surface thereof. The carbon film exhibits a Raman spectrum such that an intensity ratio represented by $I_D/I_G$ wherein $I_D$ is a maximum peak intensity at $1333\pm10$ $cm^{-1}$ in the Raman spectrum of the surface of said carbon film, and $I_G$ is a maximum peak intensity at $1500\pm100$ $cm^{-1}$ in the Raman spectrum of the surface of said carbon film, is not less than 1.2. The surface of the carbon film is a smooth surface having an arithmetic mean roughness R of not more than 0.05 μm. Further, the ironing step includes iron-working an aluminum sheet in a
(Continued)

dry process using no lubricant while maintaining an ironing ratio in excess of 40%.

2 Claims, 3 Drawing Sheets

(51) Int. Cl.
  *B21D 37/16* (2006.01)
  *B21D 37/18* (2006.01)
  *C23C 16/27* (2006.01)

(58) Field of Classification Search
  USPC .................................................. 72/347
  See application file for complete search history.

(56) References Cited

U.S. PATENT DOCUMENTS

| | | | | |
|---|---|---|---|---|
| 5,778,722 | A * | 7/1998 | Saiki | B21D 22/28 |
| | | | | 72/347 |
| 8,413,477 | B2 * | 4/2013 | Bauer | B21D 53/886 |
| | | | | 72/347 |
| 9,074,278 | B2 | 7/2015 | Hasegawa et al. | |
| 2006/0216515 | A1 | 9/2006 | Kazahaya et al. | |
| 2013/0205862 | A1 * | 8/2013 | Takahashi | B21D 22/286 |
| | | | | 72/342.3 |
| 2015/0217357 | A1 | 8/2015 | Tomaru et al. | |
| 2017/0216927 | A1 | 8/2017 | Yoshida et al. | |

FOREIGN PATENT DOCUMENTS

| | | |
|---|---|---|
| JP | 58-50501 A | 3/1983 |
| JP | 05-169162 A | 7/1993 |
| JP | 06-297207 A | 10/1994 |
| JP | 07-149583 A | 6/1995 |
| JP | 08-090092 A | 4/1996 |
| JP | 2006-055862 A | 3/2006 |
| JP | 2013-163187 A | 8/2013 |
| TW | 200503873 A | 2/2005 |

OTHER PUBLICATIONS

International Search Report of PCT/JP2016/073841 dated Nov. 1, 2016.
JP 07149583 JPO Machine Translation (Year: 2020).

* cited by examiner

DIE FOR IRONING WORKING AND DIE MODULE

CROSS REFERENCE TO RELATED APPLICATIONS

This invention application is a Continuation of U.S. application Ser. No. 15/750,224 filed Feb. 5, 2018, which is a National Stage of International Application No. PCT/JP2016/073841 filed Aug. 15, 2016, claiming priority based on Japanese Patent Application No. 2015-166675 filed Aug. 26, 2015, the contents of all of which are incorporated herein by reference in their entirety.

TECHNICAL FIELD

This invention relates to a die for ironing working having a carbon film formed on the working surface thereof. More specifically, the invention, further, relates to a die module equipped with the die.

BACKGROUND ART

As is well known, a carbon film containing a diamond component which is a crystal of carbon is extremely hard and exhibits excellent wear resistance. Therefore, it is an accepted practice to form the carbon film on the surfaces of the cutting tools such as byte, end mill, file and the like, on the surfaces of the molds for plasticity working, such as punch and die, and on the surfaces of slide members such as valve lifter and bearing in order to improve the workability and to lengthen the mechanical life.

As the carbon film, there can be exemplified a diamond film containing much diamond component and a DLC film (diamond-like carbon film) containing much graphite component. Compositions and properties have been extensively studied concerning the carbon films applied to, specifically, cutting tools and molds for plasticity working.

A patent document 1, for example, proposes a jig for metal working having a hard carbon film formed on the surface thereof that slides relative to a metal that is to be worked, the hard carbon film comprising diamond and amorphous carbon, having a surface roughness Rmax of not more than 2 μm, and having an intensity ratio $I_G/I_D$ of 0.2 to 20 ($I_D/I_G$=0.05 to 5), wherein $I_D$ is a maximum peak intensity present at 1333±10 cm$^{-1}$ in the Raman spectral analysis and $I_G$ is a maximum peak intensity present at 1500±100 cm$^{-1}$. The jig for metal working, if concretely speaking, is a die or a punch used for draw working, or is a drawing die used for stretching the wires.

A patent document 2 proposes a diamond film for the cutting tools formed on a base material, the film comprising a plurality of film layers, and the mechanical properties of the film layers being controlled by the intensity ratio ($I_D/I_G$ or $I_G/I_D$) based on the Raman spectral analysis.

A peak in a region near 1333 cm$^{-1}$ in the Raman spectral analysis stems from the diamond component while a peak in a region near 1500 cm$^{-1}$ stems from the graphite component. Therefore, a large strength ratio ($I_D/I_G$) means that the diamond component is contained more and the graphite component is contained less. Namely, the carbon film comprises a highly pure diamond and has a high hardness.

In the above patent documents 1 and 2, the intensity ratios ($I_G/I_D$ or $I_D/I_G$) in the Raman spectral analysis are set to lie in predetermined ranges in order to improve the wear resistance and to lengthen the life of the films.

Metals are plastically worked, usually, by press working as represented by draw working and ironing working. For example, metal cans like aluminum cans are produced through the steps of punching a flat metal sheet into a disk of a predetermined size, drawing the disk to form a lowly drawn can of a small height, followed by ironing working to reduce the thickness to thereby form a metal can of a basic form having a large height.

The above press working and, specifically, the draw working is often executed without lubrication but instead forming a carbon film on the mold. For example, a patent document 3 discloses a mold capable of draw-working aluminum even without using a lubricant, the surface of the mold being provided with a film of diamond-like carbon in a thickness of 0.5 μm to 5 μm.

However, the ironing working is such a forming that a jig that is used slides on a workpiece to a large degree producing a severe resistance. As the ironing ratio increases, further, the working surface of the die is affected by the worked material that underwent hardening. Further, as the ironing working (reduction of thickness) proceeds, a large surface pressure is exerted on the working surface of the die. Therefore, despite the above conventional carbon film is provided, the die still has only a low limit of forming and cannot withstand the ironing working of a large ratio. For example, in the case of the ironing working at an ironing ratio of not less than 40%, the sliding resistance becomes so great between the jig and the workpiece that a tensile stress in excess of an allowable limit is exerted on the workpiece due to a reduction in the thickness resulting in the occurrence of a defective forming.

Here, the ironing ratio is a ratio of reduction in the sheet thickness. If the sheet thickness before the ironing working is denoted by $t_0$ and the sheet thickness after the working by $t_1$, then the ironing ratio is expressed by the following formula, $$\text{Ironing ratio (\%)}=100\times(t_0-t_1)/t_0$$

Namely, as the ironing ratio increases, an increased surface pressure is exerted on the die meaning a severe forming.

PRIOR ART DOCUMENTS

Patent Documents

Patent document 1: JP 05-169162
Patent document 2: JP 06-297207
Patent document 3: JP 08-90092

OUTLINE OF THE INVENTION

Problems that the Invention is to Solve

It is, therefore, an object of the present invention to provide a die for ironing working having a carbon film which enables the ironing working to be effectively executed without causing defective forming even when the ironing working is executed at a high ironing ratio in a so-called dry process (non-lubricated system or lowly lubricated system).

Another object of the present invention is to provide a die module equipped with the die for ironing working.

Means for Solving the Problems

According to the present invention, there is provided a die for ironing working, said die having a carbon film that is so formed as to cover at least a working surface thereof, said carbon film exhibiting such a Raman spectrum that an intensity ratio represented by the following formula (1), $$I_D/I_G \quad (1)$$

wherein $I_D$ is a maximum peak intensity at $1333\pm10$ cm$^{-1}$ in the Raman spectrum of the surface of the carbon film, and $I_G$ is a maximum peak intensity at $1500\pm100$ cm$^{-1}$ in the Raman spectrum of the surface of the carbon film, is not less than 1.0, and a surface of said carbon film being a smooth surface having an arithmetic mean roughness R of not more than 0.1 μm.

In the die for ironing working of the present invention, it is desired that:
(1) The carbon film is a diamond film having said intensity ratio of not less than 1.2; and
(2) The surface of the carbon film has the arithmetic mean roughness Ra of not more than 0.05 μm.

According to the present invention, there is, further, provided a die module comprising the die for ironing working, and a holder which is so provided as to hold a non-working surface of said die from an upstream side in a working direction and from a downstream side in the working direction, said holder having therein a temperature-control fluid passage for so flowing a temperature-control fluid as to come in contact with the non-working surface of the die.

In the die module, it is desired that:
(3) Said temperature-control fluid passage is so formed that, as viewed on a side section along the direction of working, said temperature-control fluid comes in contact with both a side surface which is the non-working surface of said die on the upstream side in the working direction and a side surface which is the non-working surface of the die on the downstream side in the working direction; and
(4) Said carbon film is formed on the die for ironing working continuously up to the non-working surface that comes in contact with the fluid that flows in the temperature-control fluid passage.

Effects of the Invention

The die for ironing working of the present invention is capable of producing formed articles (small-thickness articles) having secular surfaces or smooth surfaces of a level close to secular surfaces without accompanied by defective forming even in executing a severe ironing working of an ironing ratio of, for example, about 40% or in excess of 40%.

The die module equipped with the die for ironing working, further, has the holder that is so provided that the fluid for temperature control flows so as to come in contact with the non-working surfaces of the die. Upon suitably flowing a fluid for cooling or a fluid for heating, therefore, the temperature of the die can be controlled to lie in a predetermined range.

Specifically, since the carbon film is continuously formed up to the portions with which the fluid for temperature control comes in contact, the temperature of the die is controlled via the carbon film that has high heat conductivity, and the temperature of the die as a whole can be quickly controlled to remain at a predetermined temperature. Further, the fluid for temperature control comes in contact even with the non-working surfaces close to the working surface of the die enabling the temperature to be effectively controlled. The temperature can be more quickly controlled even by so providing the temperature-control fluid passage that the fluid for temperature control comes in contact with both the non-working surface of the die on the downstream side in the working direction and the non-working surface of the die on the upstream side in the working direction.

It is, further, made possible to effectively relax the thermal strain of the die caused by a change in temperature, to lengthen the life of the die and to produce the formed articles maintaining stability in the precision.

The die for ironing working of the invention is capable of producing formed articles having specular surfaces or smooth surfaces of a level close to specular surfaces even when the ironing working is executed at a high ironing ratio. Therefore, the die for ironing working of the invention can be favorably used for producing metal cans such as aluminum cans.

MODES FOR CARRYING OUT THE INVENTION

Prior to describing the die for ironing working of the present invention, described below is the press working based on the ironing working by using the die.

Figure 1:
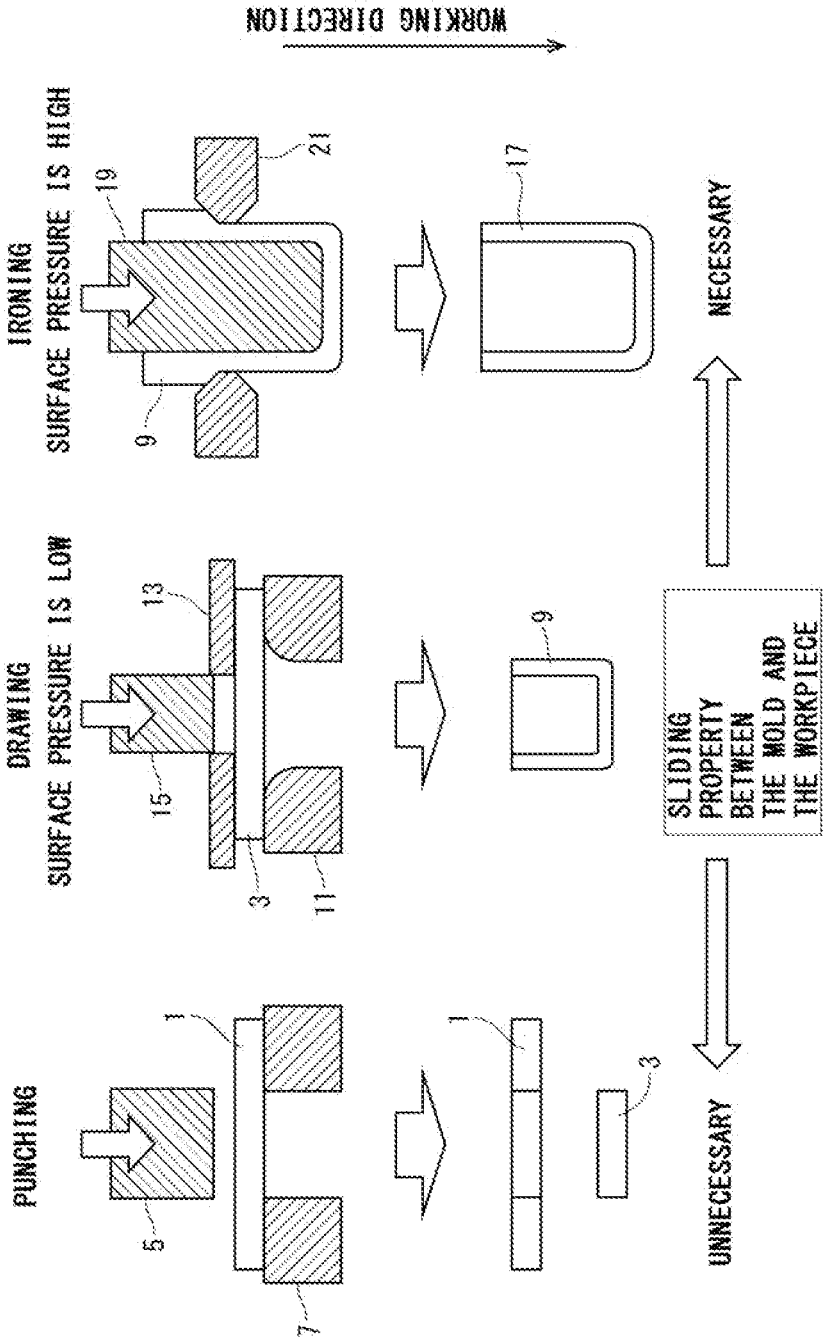
FIGS. 1A, 1B and 1C are views illustrating a process of press forming based on the ironing working.

FIGS. 1A, 1B, and 1C illustrate a process for producing metal cans, which is a representative example of the process of press forming based on the ironing working.

Referring to FIGS. 1A, 1B, and 1C, a blank (e.g., aluminum sheet) 1 used for forming metal cans is, first, subjected to a punch working to thereby obtain a disk 3 for forming a metal can (see FIG. 1A).

The punch working is carried out by using a punch 5 that has an outer diameter corresponding to the diameter of the disk 3, and a die 7 that holds the blank 1 and has an opening that corresponds to the diameter of the disk 3. Namely, the blank 1 held on the die 7 is punched by the punch 5 to obtain the disk 3 of a predetermined size.

Depending upon the form of an article produced by the above production process, the blank 1 may often be punched in any other shape (e.g., rectangular shape).

The thus obtained disk 3 is subjected to a draw working to thereby obtain a drawn can of a small height (cylindrical body with bottom) 9 (see FIG. 1B).

In the draw working, the punched disk 3 is held on the die 11, and the circumference of the disk 3 is held by a jig 13 for holding the blank. The die 11 has an opening formed therein, and the disk 3 is pushed into the opening of the die 11 by using a punch 15 for drawing, and a draw-formed can 9 is thus obtained.

A curvature is formed at the corner portion at an upper end of the opening of the die 11 (on the side holding the disk 3) permitting the disk 3 to be quickly pushed into the opening of the die 11 without being folded. The outer diameter of the punch 15 has been set to be smaller than the diameter of the opening of the die 11 by an amount corresponding to nearly the thickness of the disk 3. That is, in the draw working, the thickness is not almost decreased. Here, the draw working may often be carried out a plurality of number of times depending on the shape of the formed article.

Next, the draw-formed can 9 obtained above is subjected to an iron working whereby there is formed a metal can body (draw-ironed can) 17 having a large height and a decreased thickness (see FIG. 1C).

In the ironing working, a punch 19 for ironing is inserted in the draw-formed can 9 obtained above by the draw working. The punch 19 is then descended letting the outer surface of the cylindrical body 9 to be press-contacted to the inner surface of a ring-shaped die 21. The thickness of the side wall of the cylindrical body 9 is thus decreased by the die 21. There is thus obtained a metal can body 17 having a decreased thickness and an increased height depends on the degree of decrease in the thickness.

In a series of steps of punch working, draw working and ironing working as will be understood from FIGS. 1A, 1B, and 1C, no sliding property is required in the punch working. However, the sliding property between the mold that is used and the workpiece is more required as the step proceeds from the draw working toward the ironing working. In particular, the ironing working requires most the sliding property since the surface pressure in excess of a yield stress is exerted on the workpiece.

Therefore, it becomes necessary to form a carbon film that will be described later on the working surface (on where the die 21 comes in contact with the workpiece) of the die 21 used for the ironing working.

<Die for Ironing Working>

Figure 2:
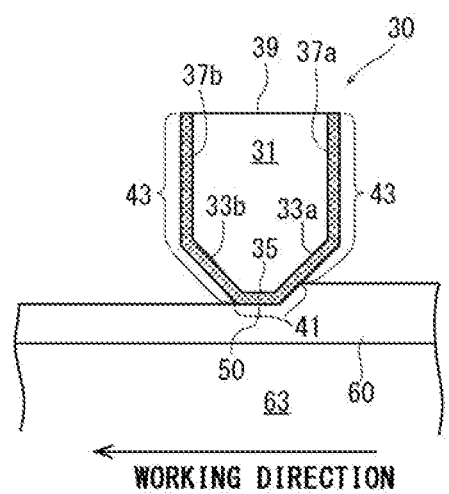
FIG. 2 is a side view schematically illustrating a die for ironing working of the present invention.

With reference to FIG. 2 together with FIGS. 1A, 1B, and 1C (specifically, FIG. 1C) mentioned above, a die 30 for ironing working of the invention generally designated a 30 has a carbon film 50 formed on the surface of a rigid base material 31.

Namely, the die 30 has a working surface which as a whole becomes narrow toward an end on the side that faces a workpiece 60 during the ironing working, and includes a pair of tilted surfaces 33a, 33b and an end surface 35 which is flat or very nearly flat between the tilted surfaces 33a and 33b. The tilted surfaces 33a and 33b are, respectively, continuous to side surfaces 37a and 37b that are extending in parallel with each other and are continuous to a surface 39 that faces the working surface.

The surface of the workpiece 60 on the side opposite to the die 30 is brought into press-contact with a punch 63 for ironing.

As will be learned from FIG. 2, the tilted surface 33a and the side surface 37a are located on the upstream side in the working direction, the tilted surface 33b and the side surface 37b are located on the downstream side in the working direction, the region that comes in contact with the workpiece 60 serves as a working surface 41, and the region that does not come in contact with the workpiece 60 is a non-working surface 43.

In the die 30 for ironing working of the invention, the carbon film 50 is formed on at least the working surface 41 (i.e., the surface on where the surface pressure is exerted during the ironing working). In an embodiment of FIG. 2, the carbon film 50 is extending up to the non-working surface 43. Specifically, the carbon film 50 is so formed as to cover the tilted surfaces 33a, 33b and the side surfaces 37a, 37b. If mentioned in connection with the ironing working, it will suffice if the carbon film 50 is formed on the working surface 41 only. However, if an end of the carbon film 50 is present near the working surface 41, there occurs a problem of peeling of the film. This inconvenience, however, can be effectively avoided by extending the carbon film 50 to a position very far away from the working surface 41 as shown in FIG. 2. Moreover, by extending the carbon film 50 up to the regions of the tilted surfaces 33a, 33b and the side surfaces 37a, 37b such that the rigid base material 31 is nearly entirely covered with the carbon film 50, it is made easy to adjust the temperature of the die 30 as a whole to lie in a predetermined range by utilizing a high heat conductivity of the carbon film 50. That is, by bringing the fluid for cooling or the fluid for heating into contact with the carbon film 50 on the non-working surface 43, the temperature of the die 30 can be easily adjusted. Besides, since the rigid base material 31 has been covered with the carbon film 50, the rigid base material 31 is effectively prevented from being corroded with the fluid for cooling or heating.

Here, as a matter of course, there arises no problem even if the carbon film 50 is extended up to the opposing surface 39 to cover the entire rigid base material 31 with the carbon film 50.

In the present invention, the carbon film 50 exhibits an intensity ratio represented by the following formula (1), $$I_D/I_G \tag{1}$$

wherein $I_D$ is a maximum peak intensity at $1333\pm10$ cm$^{-1}$ in the Raman spectrum of the surface of the carbon film, and $I_G$ is a maximum peak intensity at $1500\pm100$ cm$^{-1}$ in the Raman spectrum of the surface of the carbon film, of not less than 1.0 and, preferably, not less than 1.2.

The peak intensity $I_D$ stems from the diamond component in the film while the peak intensity $I_G$ stems from the graphite component in the film. Therefore, the larger the peak intensity ratio is, the smaller the graphite content is, meaning that the film almost comprises the diamond crystals (film of highly pure diamond).

For example, the carbon film 50 having a peak intensity ratio within the above range is a highly hard diamond film having a Vickers' hardness of not less than 8,000. Further, the diamond crystals are highly stable in a chemical sense, and are suppressed from reacting with the workpiece on the interface thereof. This assures good slipping property and makes it possible to execute severe ironing working at an ironing ratio in excess of 40% under dry-processing conditions. In the case of a carbon film having a peak intensity ratio smaller than the above range, such as a carbon film containing much graphite component other than the diamond component or, in other words, in the case of a diamond-like carbon film, on the other hand, the slipping property is small and the forming becomes defective if the ironing ratio exceeds 40%.

Here, if the peak intensity ratio is too large, then the carbon film 50 becomes brittle and the durability is spoiled. Therefore, the peak intensity ratio should not be more than 5.

In the above-mentioned highly hard carbon film 50 of the present invention, further, it is important that the surface has a roughness Ra (JIS B-0601-1994) of not more than 0.1 μm and, specifically, not more than 0.05 μm.

That is, the carbon film 50 having the above peak intensity ratio in the Raman spectrum, usually, acquires a relatively rough surface. In the ironing working, however, the workpiece 60 receives a very large surface pressure. Specifically, the surface pressure increases with an increase in the ironing ratio. Therefore, the working surface 41 of the die 30 (surface of the carbon film 50) is just transferred onto the surface of the workpiece 60. As a result, if the carbon film 50 has a rough surface, it becomes difficult to realize the surface of the workpiece 60 in a state of the specular surface or in a state of the surface close to the specular surface.

Here, according to the present invention, the surface of the carbon film 50 having the peak intensity ratio lying in the above range is polished, and the surface roughness Ra is adjusted to lie in the above small range so that the coefficient of friction μ is not more than 0.1 relative to various kinds of materials during the working. The sliding property is thus enhanced, and the surface of the formed article obtained by ironing-working the workpiece 60 is realized in a specular surface having the similar surface roughness or in a smooth surface close to a specular surface.

The carbon film 50 having the above-mentioned peak intensity ratio and the surface roughness Ra is formed on the surface of the rigid base material 31 by a known method such as plasma CVD method or microwave plasma CVD, high-frequency plasma CVD or thermal plasma CVD and, then the surface thereof is polished.

To form the film, there is, usually, used a starting gas obtained by diluting a hydrocarbon gas such as methane, ethane, propane or acetylene down to about 1% with a hydrogen gas. The starting gas is often mixed with a gas such as oxygen, carbon monoxide or carbon dioxide in small amounts to adjust the quality of the film and the rate of forming the film.

The film is formed by using the starting gas, heating the rigid base material 31 at a high temperature of 700 to 1000° C., generating a plasma using microwaves or high-frequency waves, decomposing he starting gas in the plasma to form active species, and growing the diamond crystals on the rigid base material 31. In forming the film as described above, hydrogen atoms dissociated in the plasma work to selectively etch the graphite or the amorphous carbon formed on the rigid base material 31, whereby the film is formed containing much diamond component and showing such a Raman spectrum that the peak intensity ratio thereof lies within the above-mentioned range.

Here, the carbon film being formed as described above is accompanied by the etching of graphite or amorphous carbon on the surface thereof. Therefore, the diamond crystals are allowed to grow easily and the surface of the film tends to acquire a roughness Ra larger than the above-mentioned range. According to the present invention, therefore, the surface of the carbon film 50 formed on the rigid base material 31 is polished such that the peak intensity ratio in the Raman spectrum and the surface roughness Ra are both within the above-mentioned ranges.

The surface of the formed carbon film can be polished by a known method.

There may be employed a mechanical polishing method which grinds the carbon film by using diamond grains (grind stone) or a polishing method that utilizes a chemical action. Or there may be employed a polishing method combining these mechanical method and chemical method together. Due to these polishing methods, the surface roughness Ra of the film can be adjusted to lie in the above-mentioned range to thereby obtain the carbon film 50 as desired.

As the rigid base material 31 forming the carbon film 50 on the surface thereof according to the present invention, there is used a material having a rigidity capable of withstanding the severe ironing working that involves a high surface pressure and having a heat resistance capable of withstanding the heating at a high temperature at the time of forming the carbon film 50.

As the above material, there can be exemplified a so-called super hard alloy obtained by sintering a mixture of a tungsten carbide (WC) and a metal binder such as cobalt; a cermet obtained by sintering a mixture of a metal binder such as nickel or cobalt and a metal carbide such as titanium carbide (TiC) or a titanium compound such as titanium carbonitride (TiCN); or hard ceramics such as silicon carbide (SiC), silicon nitride ($Si_3N_4$), alumina ($Al_2O_3$) or zirconia ($ZrO_2$).

The die 30 for ironing working of the invention having the above-mentioned carbon film 50 excels in formability, is capable of effectively executing sever ironing working even in a dry process (non-lubricated system without using lubricant such as wax or the like or lowly lubricated system using lubricant such as wax or the like but in very small amounts) maintaining a limit of ironing ratio in excess of 40%.

The ironing working using the die 30 for ironing working can be applied to various metals and alloys. By using the die 30 for ironing working of the invention, it is possible to severely iron-work at a high ironing ratio such metals as aluminum, copper, steel and alloys containing metals thereof, as well as surface-treated steel sheets such as tin-plated steel sheet like tin plate and conversion-treated aluminum sheet, and pre-coated metal sheets having an organic coating on at least one surface thereof.

Specifically, the die 30 for ironing working of the invention can be favorably used for the ironing working at the time of producing metal can bodies in a process shown in FIGS. 1A, 1B, and 1C above, and can be most favorably used for the production of aluminum cans that are highly reactive and cause the appearance to become defective and the slipping property to be deteriorated due to adhesion.

<Die Module>

The die 30 for ironing working of the invention is used for the ironing working, usually, as a die module equipped with a holder forming therein a passage for flowing of a temperature-control fluid.

Figure 3:
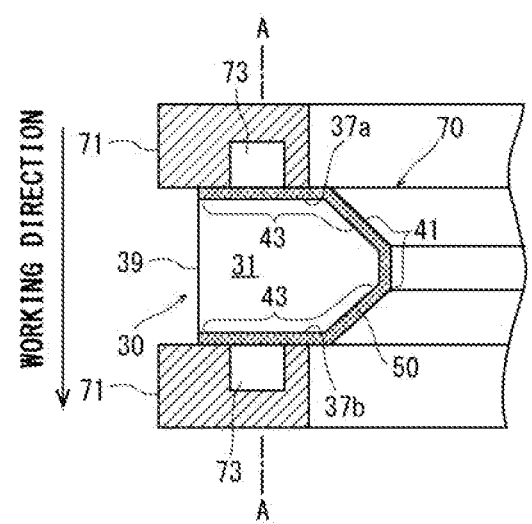
FIG. 3 is a side sectional view schematically illustrating a portion of a die module equipped with the die for ironing working of FIG. 2.
Figure 4:
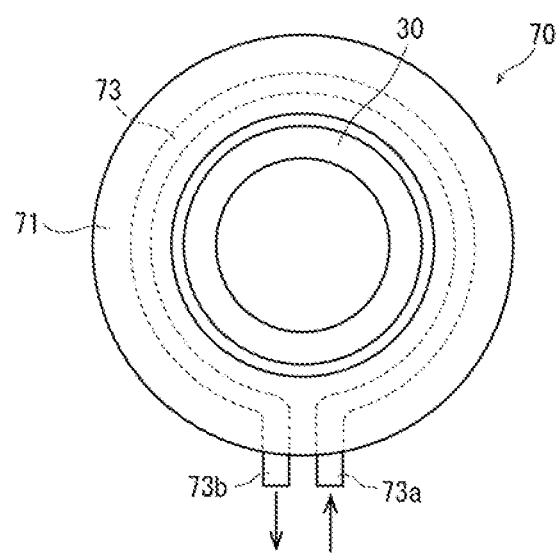
FIG. 4 is a plan view of the die module of FIG. 2.

FIGS. 3 and 4 are a side sectional view (FIG. 3) illustrating the die module used in the ironing working (see FIG. 1C) in the process for producing metal cans and a plan view thereof (FIG. 4). The die module as a whole is designated at 70, and the die is illustrated using the same reference numerals as those of FIG. 2.

In FIGS. 3 and 4, the die 30 in the die module 70 has the shape of a ring (see FIG. 4). The die module 70 is equipped with a holder 71 that holds the non-working surface 43 of the die 30 of such a shape from the downstream side in the working direction and from the upstream side in the working direction. As will be best understood from FIG. 3, the die 30 is fixed to the holder 71 of the ring-shape such that the die 30 is held by the side surface 37a on the upstream side in the working direction and by the side surface 37b on the downstream side in the working direction (both of which surfaces are the non-working surfaces 43).

The holder 71 is made of a metal such as steel, stainless steel or aluminum, and has a component that comes in close contact with the side surface 37a and a component that comes in close contact with the side surface 37b, the components being fitted to the holder 71 using screws with the die 30 being held there between.

In the holder 71, there is formed a passage 73 for flowing a fluid for temperature control. The passage 73 is fed with the temperature-control fluid through a feed port 73a and discharges the temperature-control fluid from a discharge port 73b. The form of the passage is suitably designed so that the temperature is controlled efficiently and homogeneously. For instance, the water or oil is used as the temperature-control fluid to maintain the die 30 at a predetermined temperature contributing to stabilizing the slipping property and the precision of the formed articles, relaxing thermal stress in the die 30, and extending the life thereof.

In FIG. 3, the fluid passage 73 for controlling the temperature of the die 30 is so formed that the temperature-control fluid comes into direct contact with the side surface 37a on the upstream side in the working direction and with the side surface 37b on the downstream side in the working direction. Besides, in this embodiment, the carbon film 50 is extending up to the portions of the side surfaces 37a and 37b where the temperature-control fluid comes in direct contact with. Namely, the temperature of the die 30 is controlled by the temperature-control fluid as the temperature-control fluid comes in contact with the carbon film 50.

The carbon film 50 excels in heat conductivity and has been formed to cover the whole surface of the die 30 starting from the working surface 41 except the surface 39. In the die module 70, therefore, the temperature of the die 30 can be controlled more efficiently via the carbon film 50 than via the rigid base material 31 that has heat conductivity poorer than that of the carbon film 50. For instance, by using a coolant as the temperature-control fluid and by executing the ironing working while flowing the cooling medium in the passage 73, it is made possible to cool the whole die 30 down to a predetermined level inclusive of the working surface 41 where the temperature rises most due to the heat of friction during the ironing working. During the stand-by period when the ironing working has not been executed, the heating medium is suitably flown into the passage 73 to so control the temperature of the die 30 that the temperature there is not lowered down unnecessary. Therefore, the die can be favorably used for forming a pre-coated sheet having an organic film that is very subject to be affected by the temperature during the forming.

With the die module 70 of the above structure, the temperature-control fluid such as water does not come in direct contact with the rigid base material 31 of the die 30. Therefore, the rigid base material 31 is effectively prevented from corroded by the temperature-control fluid, and the life of the die 30 can be extended.

The above-mentioned die module 70 may be used in one stage to execute the ironing working, or may be used being arranged in a plurality of stages via suitable spacers to execute the ironing working.

EXAMPLES

The invention will now be described by way of the Experimental Examples.

In the following Experimental Examples, the surface roughness and the peak intensities in the Raman spectrum were measured by the methods described below.

Surface Roughness;

By using a surface roughness meter (Surfcom 20005D3) manufactured by Tokyo Seimitsu Co., Ltd. arithmetic mean roughness Ra was measured in compliance with the JIS-B-0601.

Figure 5:
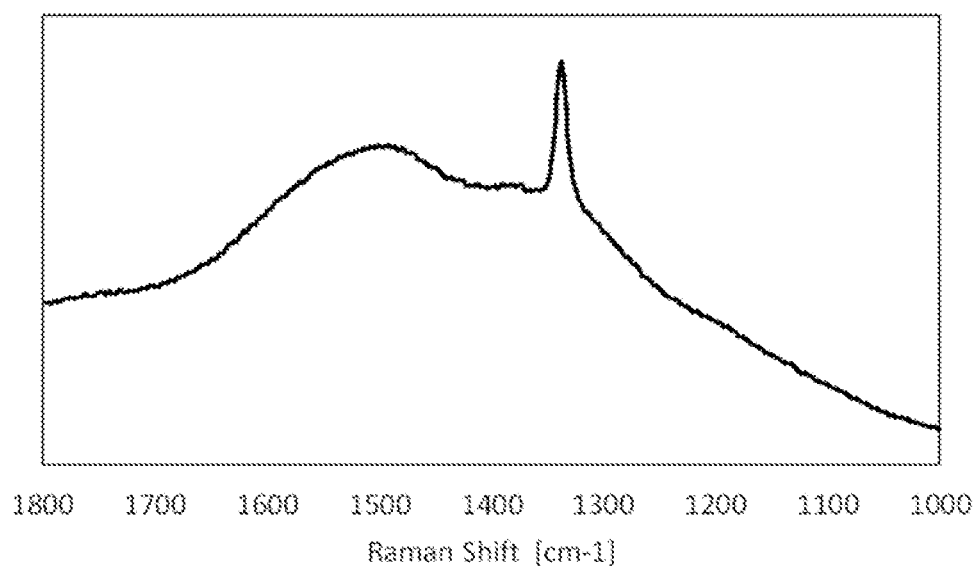
FIG. 5 is a graph of a Raman spectrum of the surface of the die.

Peak Intensities in the Raman Spectrum;

The Raman spectrum was measured by using a Raman spectroscope (DXR Raman Microscope) manufactured by Thermofisher Scientific K.K. FIG. 5 shows an example of the Raman spectrum from which it will be learned that a sharp peak $I_D$ has been detected near 1333 cm$^{-1}$ and a mild peak $I_G$ has been detected near 1500 cm$^{-1}$. A curve of the obtained Raman spectrum was approximated by a quadratic polynomial. By regarding the quadratic polynomial as a base line, the Raman spectrum was corrected, and the highest peak strength was obtained out of the peaks present in a given section.

The die for ironing working was the one obtained by coating the surface of the base material of a super hard alloy with a carbon film by the hot filament CVD. During the coating operation, the film-forming conditions were varied in order to vary the state of the carbon film for the purpose of comparison.

Experimental Example 1

An aluminum sheet was iron-worked by using a die coated on the surface thereof with diamond. The aluminum sheet was the one obtained by rolling the A3104 material so as to acquire a thickness of 0.27 mm which was then draw-worked to form a cylindrical body with bottom of a diameter of $\phi$ 95 mm so as to be used for the forming test. The forming test consisted of moving a punch of an outer diameter of $\phi$ 66 mm at a speed of 1 m/s by using a hydraulic press to, first, execute the draw-working to form a cylinder of $\phi$ 66 mm, which was then subjected to the ironing working three times. In this case, the inner diameter of the die was varied in each of the steps to vary the ironing ratio in the final step in order to compare the formed cans. The occurrence of defective forming in this case was as shown in Table 1.

According to Table 1, when the die covered with the so-called DLC film (sample No. 1) was used in the dry process, the workpiece adhered to the mold and the DLC film peeled off despite the ironing ratio was as low as about 20%. Therefore, the article could not be formed. On the other hand, when the dies having intensity ratios $I_D/I_G$ in the Raman spectrum of not less than 1.0 were used (sample Nos. 2, 3, 4 and 5), the workpiece did not adhere to the mold despite the ironing ratio was in excess of 35%, and there could be obtained formed cans having favorable appearance. When the dies having intensity ratios $I_D/I_G$ of not larger than 1.1 were used (samples Nos. 2 and 3), however, there occurred such a defective forming that the workpiece was broken during the ironing working at an ironing ratio of about 40% despite the surfaces of the dies were smooth enough. When the dies having intensity ratios $I_D/I_G$ of not less than 1.2 were used (samples Nos. 4 and 5), on the other hand, there did not occur any such a defective forming as breakage despite the ironing working was executed at an ironing ratio of as high as about 40%, and formed articles having favorable appearance were obtained.

These results tell that the limit of working increases with an increase in the intensity ratio $I_D/I_G$.

TABLE 1

| No. | $I_D/I_G$ | Surface roughness Ra | Material of the workpiece | Lubricant | Ironing ratio | Formable | Remarks |
|---|---|---|---|---|---|---|---|
| 1 | 0.7 | 0.02 μm | A3104 | no | 20% | x | DLC |
| 2 | 1.0 | 0.02 μm | A3104 | no | 37% | o | |
|   |     |         | A3104 | no | 40% | x | |
| 3 | 1.1 | 0.02 μm | A3104 | no | 36% | o | |
|   |     |         | A3104 | no | 39% | x | |
| 4 | 1.2 | 0.02 μm | A3104 | no | 40% | o | |
| 5 | 1.3 | 0.04 μm | A3104 | no | 41% | o | |
|   |     |         | A3104 | no | 47% | o | | o—formable,
x—broken

Experimental Example 2

Next, the operations of forming, polishing and forming were repeated by using the same die in order to evaluate the effect by the surface roughness of the die. The forming operation consisted of forming a cylindrical body with bottom of ϕ 95 mm relying on the draw working followed by the ironing working of two times like in the Experimental Example 1. The polishing consisted of smoothing the surface of the die by grinding the surface of the die by also using a diamond grind stone. Table 2 shows surface roughness of the die and the occurrence of defective forming.

According to Table 2, the molds have large surface roughness in their unpolished state and cause breakage if used for the forming work. Through the polishing, however, the surface roughness of the molds decreases; i.e., protuberances on the surfaces of the molds are removed by the polishing. Therefore, the molds acquire increased inner diameters and cause a decrease in the ironing ratio. If the surface roughness Ra of the mold exceeds 0.1 μm, a breakage occurs and it is not allowed to form the can. If the surface roughness Ra of the mold is not more than 0.1 μm, on the other hand, it is allowed to form the can without accompanied by breakage. Further, if the surface roughness Ra of the mold is near 0.1 μm, breakage does not occur but the formed can gets scratched over the whole circumference thereof. It is not, therefore, allowed to obtain a can having favorable appearance. If the mold is so polished that the surface roughness Ra thereof is not more than 0.05 μm, then it is made possible to form the cans having highly specular surfaces and favorable appearance.

TABLE 2

| No. | $I_D/I_G$ | Surface roughness Ra | Material of the workpiece | Lubricant | Ironing ratio | Formable | Remarks |
|---|---|---|---|---|---|---|---|
| 6 | 1.3 | 0.30 μm | A3104 | no | 32% | x | |
| | | 0.18 μm | A3104 | no | 32% | x | |
| | | 0.11 μm | A3104 | no | 32% | x | |
| | | 0.05 μm | A3104 | no | 31% | o | Specular surface |
| 7 | 1.3 | 0.25 μm | A3104 | no | 30% | x | |
| | | 0.16 μm | A3104 | no | 29% | x | |
| | | 0.10 μm | A3104 | no | 29% | o | Scratched |
| | | 0.04 μm | A3104 | no | 28% | o | Specular surface | o—formable,
x—broken

From the above Experimental Examples, it will be learned that in order not to cause defective forming even in executing the ironing working maintaining a level of a high ironing ratio in the dry process, it is necessary that the intensity ratio $I_D/I_G$ in the Raman spectrum is maintained to be not less than 1.0 and the surface roughness Ra of the mold is maintained to be not more than 0.1 μm. In addition, in order to carryout the forming at a higher ironing ratio of about 40%, it is desired that the intensity ratio $I_D/I_G$ is maintained to be not less than 1.2. Further, in order to obtain the cans having high specular surfaces and favorable appearance, it is desired that the surface roughness Ra of the mold is not more than 0.05 μm.

Here, it should be noted that the present invention is in no way limited to the above embodiments and Experimental Examples only but can also be modified in a variety of other ways in a range without departing from the gist of the present invention.

DESCRIPTION OF REFERENCE NUMERALS

30: die for ironing working
31: rigid base material
33a, 33b: tilted surfaces
35: end surface
37a, 37b: side surfaces
41: working surface
43: non-working surface
50: carbon film
60: workpiece
63: punch for ironing working
70: die module
71: holder
73: passage for temperature-control fluid

What is claimed is:

1. A method of producing aluminum cans, including an ironing step by using a die module including a holder and an ironing die, wherein:
    said ironing die has a carbon film that is so formed as to cover a working surface thereof;
    said carbon film exhibits such a Raman spectrum that an intensity ratio represented by the following formula (1), $$I_D/I_G \qquad (1)$$

wherein $I_D$ is a maximum peak intensity at 1333±10 cm$^{-1}$ in the Raman spectrum of the surface of said carbon film, and $I_G$ is a maximum peak intensity at 1500±100 cm$^{-1}$ in the Raman spectrum of the surface of said carbon film, is not less than 1.2;
    the surface of said carbon film is a smooth surface having an arithmetic mean roughness R of not more than 0.05 μm;
    said ironing step is executed in a dry process using no lubricant maintaining an ironing ratio which is in excess of 40%;
    said ironing die having the working surface and a non-working surface, and being held by said holder in a manner of holding the non-working surface;
    said holder permitting a temperature-control fluid to flow therein; and
    said carbon film that covers the working surface extending up to the non-working surface so as to come in contact with the temperature-control fluid.

2. The method according to claim 1, wherein the temperature-control fluid comes in contact with the non-working surface of the die and does not come in contact with the working surface.

* * * * *